(12) United States Patent
Huang et al.

(10) Patent No.: US 7,169,633 B2
(45) Date of Patent: Jan. 30, 2007

(54) SOLID-STATE IMAGE SENSOR FOR IMPROVING SENSING QUALITY AND MANUFACTURING METHOD THEREOF

(75) Inventors: Chien-Chang Huang, Hsin-Chu (TW); Chih-Cheng Hsieh, Hsin-Chu (TW)

(73) Assignee: PixArt Imaging Inc., Hsin-Chu Hsien (TW)

( * ) Notice: Subject to any disclaimer, the term of this patent is extended or adjusted under 35 U.S.C. 154(b) by 150 days.

(21) Appl. No.: 10/711,666

(22) Filed: Sep. 30, 2004

(65) Prior Publication Data

US 2005/0202579 A1 Sep. 15, 2005

(30) Foreign Application Priority Data

Mar. 9, 2004 (TW) ............................ 93106263 A

(51) Int. Cl.
*H01L 21/00* (2006.01)
(52) U.S. Cl. ...................................... 438/57
(58) Field of Classification Search .............. 438/22, 438/57; 348/273; 257/620, 59
See application file for complete search history.

(56) References Cited

U.S. PATENT DOCUMENTS

| 6,246,081 | B1 | 6/2001 | Abe | |
| 6,255,640 | B1 | 7/2001 | Endo et al. | |
| 6,312,969 | B1 | 11/2001 | Abe | |
| 6,642,963 | B1 * | 11/2003 | Assadi | 348/273 |

* cited by examiner

*Primary Examiner*—Carl Whitehead, Jr.
*Assistant Examiner*—Monica D. Harrison
(74) *Attorney, Agent, or Firm*—Winston Hsu

(57) ABSTRACT

A method of forming a solid-state image sensor is provided. The method includes the steps of forming a plurality of photosensor elements on a substrate; forming a plurality of color filters on the plurality of photosensors; forming a light blocking member between adjacent color filters; and forming a plurality of microlenses on the plurality of color filters. Each photosensor with each corresponding color filter and microlens is used for receiving an incident light of specific spectrum.

5 Claims, 4 Drawing Sheets

SOLID-STATE IMAGE SENSOR FOR IMPROVING SENSING QUALITY AND MANUFACTURING METHOD THEREOF

BACKGROUND OF INVENTION

1. Field of the Invention

The present invention relates to a method for producing an image sensor, and an image sensor produced by the method, with improved imaging quality.

2. Description of the Prior Art

As with rapid development of digital image devices, digital image devices have become more popular than traditional analog image devices. However, in order to obtain better quality of digital images with higher resolution, improvement of the image sensor which is used for photoelectric conversion is necessary. In recent years, a solid-state image sensor has been miniaturized, with which a photosensor element is reduced and a drop of the sensitivity is caused.

Please refer to FIG. 1 showing a schematic diagram of a conventional digital image-capturing device 10. The digital image-capturing device 10 comprises a lens 12 and an image sensor 20. The image sensor 20 comprises a plurality of sensing units 30 each comprising a microlens 24, a color filter 25 and a photosensor element 22. When light progresses into the image-capturing device 10, the light will pass through the lens 12 and project onto the plurality of sensing units 30 through the lens 12. Each microlens 24 will collect the incident light onto the photosensor element 22 of the sensing unit 30, after drawing out light with different spectrums by using the color filter 25. For example, the blue color filter 25b is used for drawing out the light in consistent with blue light spectrum, and the green light filter 25g is used for drawing out the light in consistent with green light spectrum. Finally, the photosensor element 22 transforms the drawn light into an electrical signal. Generally speaking, the plurality of sensing units 30 are arranged in a regular manner called a Bayer pattern color filter array, as shown in FIG. 2. In FIG. 2, G, B, R respectively indicates sensing units 30 for sensing green light, blue light, and red light. An area formed by two green sensing units 30, a blue sensing unit 30 and a red sensing unit 30 is called a pixel 11. Human eyes have more sensitivity for green light than red and blue light, such that a 2:1:1 arrangement of green, blue, red sensing unit is used to be consistent with real image color. Each sensing unit 30 has a photosensor element 22 formed on a silicon substrate 16. A transfer electrode 14 formed on the photosensor element 22 is used for transferring the generated electrical signal.

The higher the image resolution is required, the smaller each pixel area is, and the smaller the area of the sensing unit is. Please refer to FIG. 3 in conjunction with FIG. 1. FIG. 3 shows a light passing through the sensing unit 30 located at the corner. Generally speaking, a light A progressing to the sensing unit 30 located at the center of the image sensor 20 can be completely sensed by the photosensor element 22, but a light B progressing to the sensing unit 30 located at a corner of the image sensor 20 has a deviation so that the light B fails to exactly project onto the photosensor element 22. As shown in FIG. 3, theoretically, the light B will pass green color filter 25g to draw out the green light constituent, and then be photo-electrically transformed to generate an electrical signal with the photosensor element 22g. Actually, the large deviation angle of the light B causes the light B to pass through the green color filter 25g and the blue color filter 25b, and is received by the photosensor element 22b. Therefore, an error occurs due to inconsistent ratio of received light for a pixel at the corner, thereby causing a color shift effect and deterioration of sensing quality. The photosensor element 22 of the sensing unit 30 at the corner will receive less light due to a larger incident angle. Uneven light sensing of the image sensor 20 results in an inconsistent image quality.

In order to overcome the above-mentioned problem, in U.S. Pat. No. 6,255,640, Endo et al. disclose a solid-state image sensing device having a specific curvature intra-layer color filter and an interlayer film for collecting the emitted light, and in U.S. Pat. Nos. 6,246,081 and 6,312,969, Abe discloses a solid-state image sensor having a light-impervious film formed on a sensor for blocking other light incident from other color filter layer. But such designations result in complicated processes, and are not proper for mass production. Under the trend of lowering the area of the sensing unit, Endo et al.'s solid-state image sensing device is limited to curvature of the specific curvature intra-layer color filter and an interlayer film. A light-impervious film of Abe's solid-state image sensor cannot block incident light from adjacent pixels. Consequently, an improvement of the image sensor is needed.

SUMMARY OF INVENTION

It is therefore a primary objective of the claimed invention to provide a solid-state image sensor for improving sensing quality and manufacturing method thereof, in order to solve the above-mentioned problems.

According to the claimed invention, a method of forming a solid-state image sensor is provided. The method includes the steps of forming a plurality of photosensor elements on a substrate; forming a plurality of color filters on the plurality of photosensors; forming a light blocking member between adjacent color filters; and forming a plurality of microlenses on the plurality of color filters. Each photosensor corresponds to each color filter and each microlens is used for receiving an incident light of specific spectrum.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
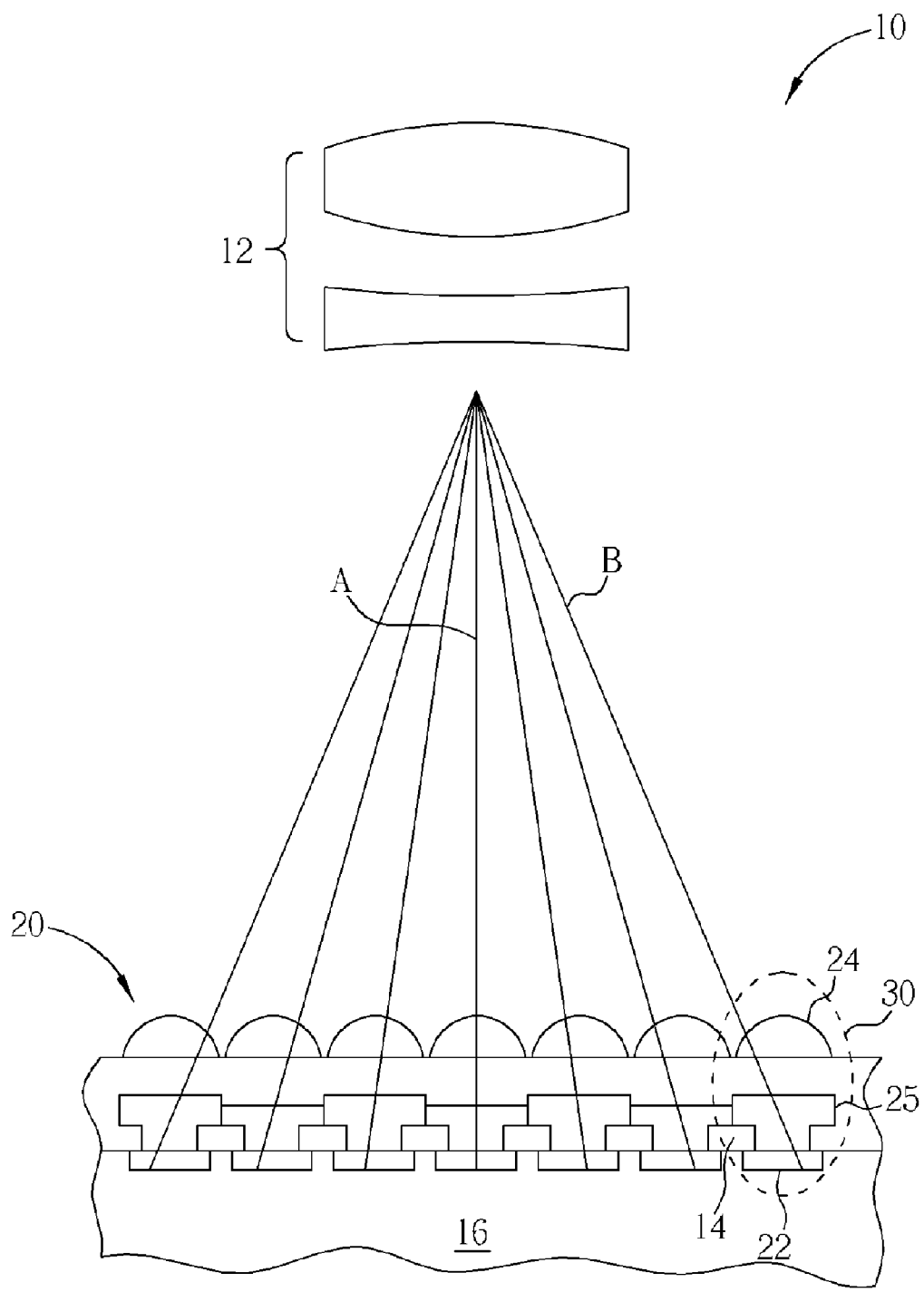
FIG. 1 is a schematic diagram of a digital image-capturing device according to prior art.
Figure 2:
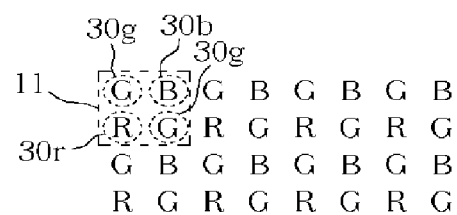
FIG. 2 is a diagram of a Bayer pattern color filter array.
Figure 3:
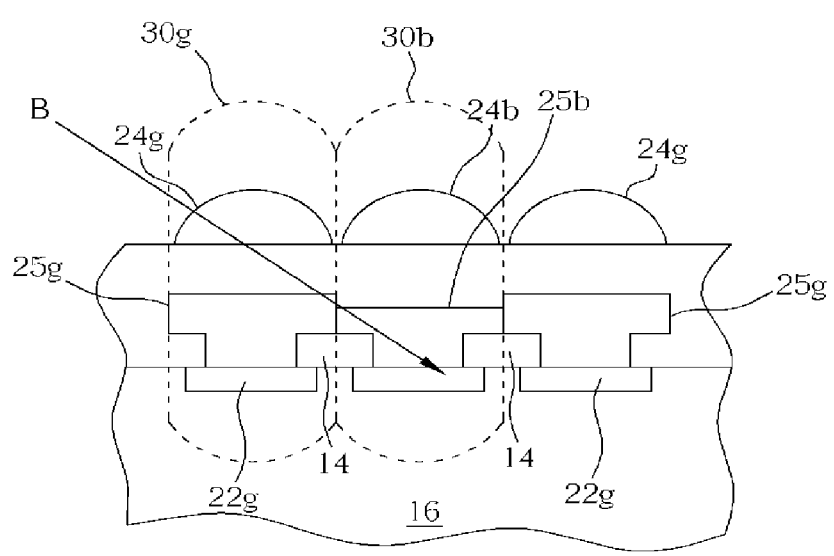
FIG. 3 shows a light passing through the sensing unit located at the corner.
Figure 4:
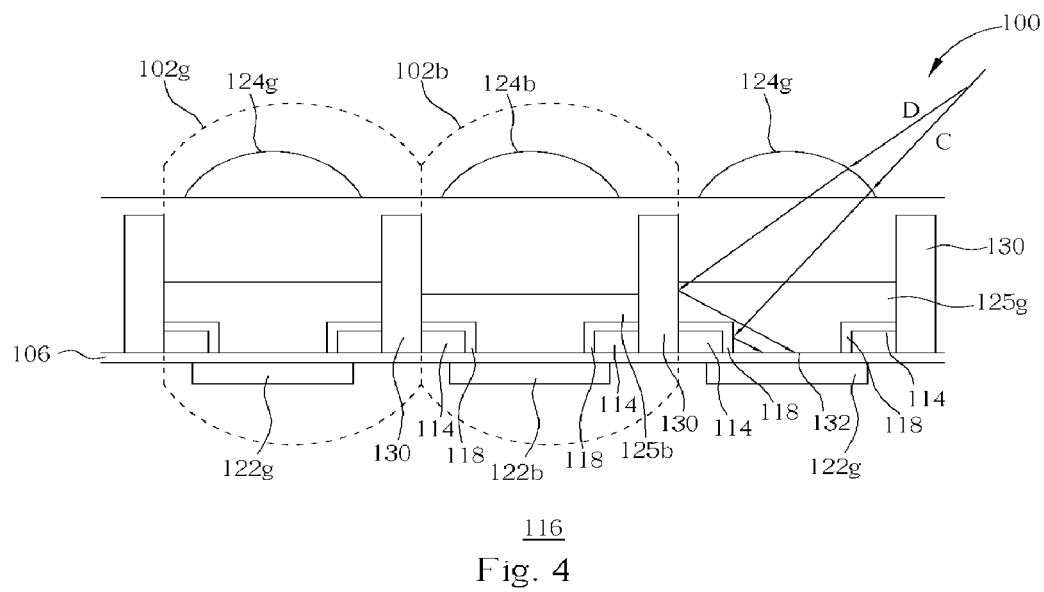
FIG. 4 shows a cross-sectional view of an image sensor according to the present invention.

Please refer to FIG. 4, which shows a cross-sectional view of an image sensor 100 according to the present invention. The image sensor 100 comprises a plurality of sensing units arranged in a Bayer pattern color filter array shown in FIG. 2. For simplicity, only a green sensing unit 102g and a blue sensing unit 102b are drawn and labeled. Photosensor elements 122b, 122g formed on the silicon substrate 116 are used for performing photoelectrical transformation. An insulating layer 106 made of SiO$_2$ is formed on the substrate 116 by using a thermal oxidation process or a chemical vapor deposition (CVD). Each sensing unit 102b, 102g includes a transfer electrode (serving as a transfer transistor) 114b, 114g over the substrate 116, (i.e. on the insulating layer 106) and respectively coupled to photosensor elements 122b, 122g. The transfer electrodes 114b, 114g are used for transferring electrical signals from the photosensor elements 122b, 122g. In addition, each sensing unit 102b, 102g contains a color filter 125b, 125g formed over the photosensor elements 122b, 122g and the transfer electrode 114b, 114g. A light-shielding film 118 formed between the transfer electrodes 114b, 114g and the color filters 125b, 125g is used for isolating the transfer electrode 114b, 114g and the color filters 125b, 125g. A light-impervious film 130 is formed between the adjacent color filters 125b, 125g by using a resist etch back process. Then microlenses 124b, 124g are respectively formed over the color filters 125b, 125g. Notice that the light blocking member 130 can be a light-impervious film made of metal or chemical compound or other light-impervious material, and its height is higher than that of each color filter 125b, 125g.

Figure 5:
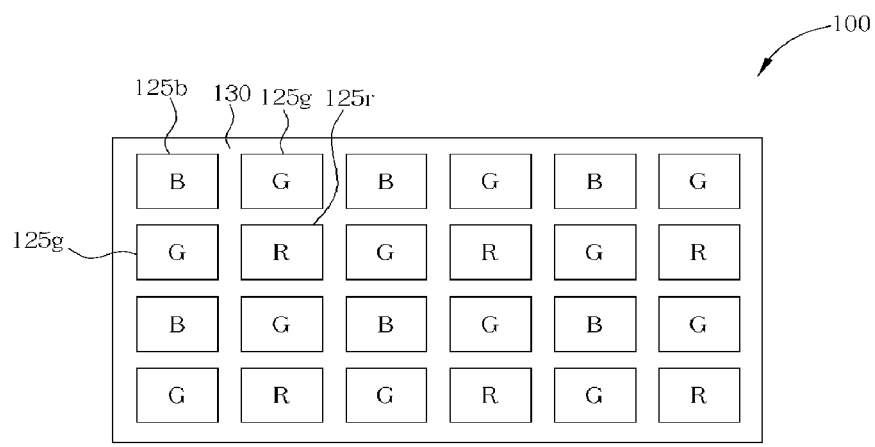
FIG. 5 shows a color filter and a light-impervious film of the image sensor shown in FIG. 4

Please refer to FIG. 5, which shows a color filter and a light blocking member of the image sensor 100 shown in FIG. 4. The letter G indicates a color filter 125g for green light, B indicates color filter 125b for sensing blue light, and R indicates a color filter 125r for sensing red light. Each color filter 125b, 125r, 125g comprises a light blocking member 130.

The operation of the image sensor 100 is described as follows. Suppose that a light C is emitted into the microlens 124g of the sensing unit 102g, in order to collect light on the surface 132 of the sensing unit 122g, i.e. the photosensor element 102, the focal length of the microlens 124g is adjusted to proper position to make the incident light project onto the surface 132 of the photosensor element 122g. As shown in FIG. 4, light C through the microlens 124g progresses into the green color filter 125g, and then reflects by means of the light-shielding film 118 to progress into the photosensor element 122g. Light D through the microlens 124g progresses into the green color filter 125g, and cannot progress toward the photosensor element 122b of the adjacent sensing unit 102b due to block of the light blocking member 130. In this way, the photosensor element 122b will not sense the green light. Meanwhile the light D will is reflected on the green photosensor element 122g. Accordingly, the light blocking member 130 set between the color filters 125b, 125g can not only block light, but can also collect the light. Certainly, a height of the light blocking member 130 can be adjusted as the location of the sensing unit. For example, the height of the sensing unit at corner is higher than that of adjacent color filter 125b, 125g, and even equals to a height of the microlens 124b, 124g, so as to achieve better effect for light isolation.

Figure 6:
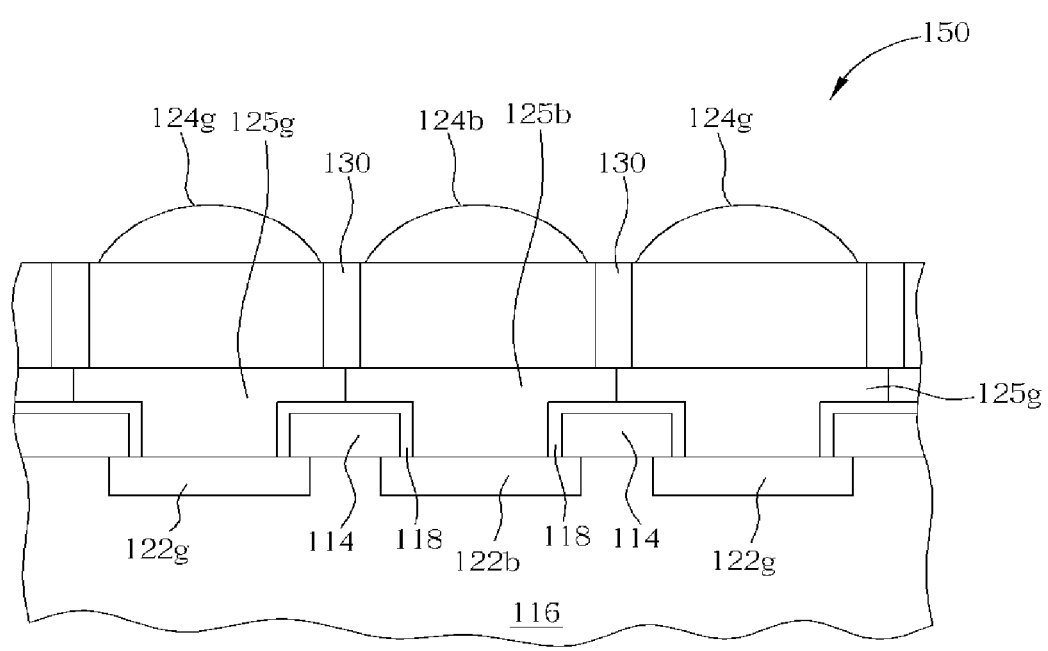
FIG. 6 shows a cross-sectional view of an image sensor of another embodiment according to the present invention.

Please refer to FIG. 6, which shows a cross-sectional view of an image sensor 150 of another embodiment according to the present invention. Differing from the image sensor 100 shown in FIG. 5, the light blocking member 130 of the image sensor 150 is formed over the transfer electrode 114 and among the two color filters 125b, 125g and the two microlenses 124b, 124g.

The blue sensing unit 102b and green sensing unit 102g and corresponding elements therein are used to illustrate the present invention, but similar arrangement can be also used in the green sensing unit 102g and the red sensing unit 102r and corresponding elements therein.

The present invention image sensor can be applied in a charge-coupled device or a CMOS image sensor.

In contrast to the prior art, the present invention solid-image sensor provides a light blocking member between the adjacent color filters, which is used for blocking the drawn light with different spectrums from the adjacent color filter, so as to prevent the photosensor element from converting the different spectrum light, resulting in color offset. In addition, the light blocking member is also used for collecting light onto the photosensor element, so as to improve sensing effect of the photosensor element. Using the present invention solid-state image sensor can reduce color coupling effect, and improve the sensing effect of the photosensor element, due to the blocking and reflection of the light blocking member. In addition, the present invention image sensor with a light blocking member is not very complicated and is suitable for mass production.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a solid-state image sensor, comprising the steps of:
    forming a plurality of photosensor elements on a substrate;
    forming a plurality of color filters on the plurality of photosensors;
    forming a light blocking member between adjacent color filters; and
    forming a plurality of microlenses on the plurality of color filters;
        wherein each photosensor corresponds to each color filter and each microlens, for receiving an incident light of specific spectrum.

2. The method of claim 1, wherein the light blocking member comprises a light-impervious film made of metal or chemical compound.

3. The method of claim 1, wherein the image sensor is a charge-coupled device (CCD).

4. The method of claim 1, wherein the image sensor is a CMOS sensor.

5. A solid-state image sensor which is produced according to the method of claim 1.

* * * * *